(12) United States Patent
Briggs et al.

(10) Patent No.: US 8,143,892 B2
(45) Date of Patent: Mar. 27, 2012

(54) SYSTEM AND METHODS FOR ACTIVE SUPPRESSION OF SUPERIOR TAGGING IN FLOW-SENSITIVE ALTERNATING INVERSION RECOVERY

(75) Inventors: Richard W. Briggs, Dallas, TX (US); Xiufeng Li, Dallas, TX (US); Kaundinya S. Gopinath, Dallas, TX (US); Subhendra N. Sarkar, Dallas, TX (US)

(73) Assignee: The Board of Regents of The University of Texas System, Austin, TX (US)

( * ) Notice: Subject to any disclaimer, the term of this patent is extended or adjusted under 35 U.S.C. 154(b) by 318 days.

(21) Appl. No.: 12/610,876

(22) Filed: Nov. 2, 2009

(65) Prior Publication Data

US 2010/0164496 A1 Jul. 1, 2010

Related U.S. Application Data

(60) Provisional application No. 61/110,548, filed on Oct. 31, 2008.

(51) Int. Cl.
*G01V 3/00* (2006.01)
(52) U.S. Cl. ........................................ 324/309; 324/307
(58) Field of Classification Search .......... 324/300–322; 600/407–445
See application file for complete search history.

(56) References Cited

U.S. PATENT DOCUMENTS

| | | | | |
|---|---|---|---|---|
| 5,034,694 | A * | 7/1991 | Sattin et al. | 324/309 |
| 7,894,875 | B2 * | 2/2011 | Van Zijl et al. | 600/419 |
| 2009/0005670 | A1 * | 1/2009 | Ichinose et al. | 600/410 |
| 2010/0268062 | A1 * | 10/2010 | Edelman | 600/410 |
| 2011/0137146 | A1 * | 6/2011 | Edelman | 600/410 |

OTHER PUBLICATIONS

"Magnetom Trio, A Time System 3T" Siemens AG 2002-2009, retrieved from www.siemens.com/healthcare, retrieved on Feb. 5, 2010.
Boss et al., "FAIR-TrueFISP imaging of cerebral in areas of high magnetic susceptibility differences at 1.5 and 3 Telsa," *J. Magn. Reson. Imaging*, 25:924-31, 2007.
Dai et al., "Continuous flow-driven inversion for arterial spin labeling using pulsed radio frequency and gradient fields," *Mag. Reson. Med.*, 60:1488-1497, 2008.
Donahue et al., "An account of the discrepancy between MRI and PET cerebral blood flow measures. A high-field MRI investigation," *NMR Biomed.*, 19:1043-54, 2006.
Fernandez-Seara et al., "Continuous arterial spin labeling perfusion measurements using single shot 3D GRASE at 3 T," *Magn. Reson Med.*, 54:1241-7, 2005.

(Continued)

*Primary Examiner* — Brij Shrivastav
(74) *Attorney, Agent, or Firm* — Fulbright & Jaworski L.L.P.

(57) ABSTRACT

Apparatuses, systems, and methods for suppression of venous artifacts from superior tagging in flow-sensitive alternating inversion recovery. The systems may include an image capture device and a controller. The controller may be configured to cause the image capture device to perform a labeling experiment, capture a first image of a slice of body tissue, perform a control experiment, and capture a second image of the slice of body tissue. The systems may be configured to perform a ninety (90) degree RF saturation pulse directed to a portion of body tissue that is superior to the first slice of body tissue imaged during at least one of the labeling experiment and/or the control experiment, and to apply a spoiler gradient subsequent to the saturation pulse during at least one of the labeling experiment and/or the control experiment.

15 Claims, 11 Drawing Sheets

OTHER PUBLICATIONS

Golay et al., "Transfer insensitive labeling technique (TILT): application to multislice functional perfusion imaging," *J. Magn. Res. Imag.*, 9:454-461, 1999.

Günther et al., "Single-shot 3D imaging techniques improve arterial spin labeling perfusion measurements," *Magn. Reson. Med.*, 54:491-8, 2005.

Kim, "Quantification of relative cerebral blood flow change by flow-sensitive alternating inversion recovery (FAIR) technique: application to functional mapping," *Magn. Reson. Med.*, 34:293-301, 1995.

Kwong et al., "MR perfusion studies with T1-weighted echo planar imaging," *Magn. Reson. Med.*, 34:878-87, 1995.

Luh et al., "QUIPSS II with thin-slice TI1 periodic saturation: a method for improving accuracy of quantitative perfusion imaging using pulsed arterial spin labeling," *Magn. Reson. Med.*, 41:1246-1254, 1999.

Parkes and Tofts, "Improved accuracy of human cerebral blood perfusion measurements using arterial spin labeling: accounting for capillary water permeability," *Magn. Reson. Med.*, 48:27-41, 2002.

Parkes, "Quantification of cerebral perfusion using arterial spin labeling: two-compartment models," *J. Magn. Reson. Imaging*, 22:732-6, 2005.

Pfeuffer et al., "Zoomed functional imaging in the human brain at 7 Tesla with simultaneous high spatial and high temporal resolution," *NeuroImage*, 17:272-286, 2002.

Wang et al., "Amplitude-modulated continuous arterial spin-labeling 3.0-T perfusion MR imaging with a single coil: feasibility study," *Radiology*, 235:218-228, 2005.

Wang et al., "Comparison of quantitative perfusion imaging using arterial spin labeling at 1.5 and 4.0 Tesla," *Magn. Reson. Med.*, 48:242-54, 2002.

Wang et al., "Pediatric perfusion imaging using pulsed arterial spin labeling," *J. Magn. Reson. Imaging*, 18:404-13, 2003.

Wong et al., "Implementation of quantitative perfusion imaging techniques for functional brain mapping using pulsed arterial spin labeling," *NMR Biomed.*, 10:237-49, 1997.

Wong et al., "Quantitative imaging of perfusion using a single subtraction (QUIPSS and QUIPSS II)," *Magn. Reson. Med.*, 39:702-8, 1998.

Wu et al., "A theoretical and experimental investigation of the tagging efficiency of pseudocontinuous arterial spin labeling," *Magn. Reson. Med.*, 58:1020-1027, 2007.

* cited by examiner (a)

(b)

SYSTEM AND METHODS FOR ACTIVE SUPPRESSION OF SUPERIOR TAGGING IN FLOW-SENSITIVE ALTERNATING INVERSION RECOVERY

CROSS-REFERENCE TO RELATED APPLICATIONS

This application claims the benefit of U.S. Provisional Application No. 61/110,548 filed Oct. 31, 2008, the entire contents of which is specifically incorporated herein by reference without disclaimer. This application is also related to commonly owned and co-filed U.S. application Ser. No. 12/610,845, filed Nov. 2, 2009, which claims the benefit of U.S. Provisional Application No. 61/110,457, filed Oct. 31, 2008, the entire contents of each of which is specifically incorporated herein by reference without disclaimer.

STATEMENT REGARDING FEDERALLY SPONSORED RESEARCH OR DEVELOPMENT

This invention was made with government support under Contract No. DAMD17-01-1-0741 awarded by DoD/U.S. Army Med. Res. Acq'n. Activity. The government has certain rights in the invention.

BACKGROUND OF THE INVENTION

1. Field of the Invention

This invention relates to medical imaging and more particularly relates to a system and methods for active suppression of superior tagging in flow-sensitive alternating inversion recovery.

2. Description of the Related Art

The perfusion of the cerebral tissue bed is a very important physiological index for evaluating function and viability. One perfusion imaging technique is pulsed arterial spin labeling (PASL). One of the most widely used PASL techniques is the flow-sensitive alternating inversion recovery (FAIR) technique.

FIG. 11 describes a schematic diagram for ASL imaging according to the prior art. The labeling of arterial blood is proximal to the tissue of interest, as shown by the blue plane on the left portion of the figure. After a delay to let labeled blood to arrive at the tissue sites, imaging acquisitions may be performed. In some ASL techniques, such as EPISTAR, control experiments are typically done using the symmetric labeling RF pulse at the distal site to minimize the MT effects (light blue plane at right).

FAIR is a symmetric PASL technique, and originally used selective inversion and non-selective inversion for control and labeling imaging. The selective and non-selective inversion RF pulses were typically hyperbolic secant pulses with duration about 15 ms. To avoid slice profile imperfections at the edges or minimize substantial subtraction errors due to the transition regions of the inversion slabs, the selective inversion slab is made wider than the imaging slab. The non-selective inversion is achieved by using the same hyperbolic secant pulse without the slab selective gradient. In those earlier studies, transmit/receive head coils were dominantly used. However, the use of transmit/receive head coil for ASL perfusion studies may give lower labeling efficiency at the edge of the head coil. Due to the limited size of the transmit/receive head coil, to have enough arterial blood labeled, a larger labeling slab has to be used, making ASL perfusion studies mainly restricted to the superior part of the brain.

There are still some unsolved problems with FAIR and similar sequences. First, the intrinsic two-sided labeling generates significant venous artifacts due to inflowing spins from the superior inversion slab in perfusion studies using limited coverage, especially when such studies are focused on the mid-brain and inferior parts of the brain containing large veins, such as the occipital lobe with sagittal sinus and the cerebellum with transverse and straight sinuses. Second, the two-sided labeling of FAIR can introduce additional potential confounds for CBF quantification using single subtraction methods when limited coverage imaging slabs are used and imaging slice(s) contain curved or tortuous arteries that go through the imaging slice(s) and come back. For accurate CBF quantification, this superior inflow should be included in the model. More simplistically, if the single subtraction method and single blood compartment model are used, the temporal width for the superior bolus should also be defined, as usually done for the inferior bolus with QUIPSS II or Q2TIPS. However, this may affect the bolus defined in the inferior side of the imaging slab, making CBF quantification using FAIR in this circumstance problematic.

With parallel imaging, multiple channel phased array coils are used for signal reception, while the body coil is typically used as the transmit coil. But, non-selective inversion with the body coil produces extra problems for FAIR. One problem is that the repetition time has to be long enough to allow the complete relaxation of labeled spins before the next non-selective inversion. Otherwise, the labeling efficiency or the signal-to-noise ratio of the perfusion map will be lower. Moreover, the CBF quantification model assumes that in the labeling experiment of the FAIR technique, the blood outside of the imaging slab should be fully relaxed. An even worse problem for body coil transmission is that the very long bolus duration from the non-selective inversion will present labeled spins in larger arteries of the imaged slice(s) during signal acquisition, generating spurious hyper-intense signals in both perfusion-weighted images and CBF maps and resulting in the overestimation of cerebral blood flow.

The referenced shortcomings are not intended to be exhaustive, but rather are among many that tend to impair the effectiveness of previously known techniques in disease diagnosis and management; however, those mentioned here are sufficient to demonstrate that the methodologies appearing in the art have not been satisfactory and that a significant need exists for the techniques described and claimed in this disclosure.

SUMMARY OF THE INVENTION

From the foregoing discussion, it should be apparent that a need exists for an apparatus, system, and method for active suppression of venous artifacts caused by superior tagging in flow-sensitive alternating inversion recovery ASL, which can be achieved by proper techniques of superior saturation.

A system is presented for active suppression of venous artifacts caused by superior tagging in flow-sensitive alternating inversion recovery. In one embodiment, the system includes an image capture device and a controller unit. The image capture device may include a magnet, one or more gradient coils, and one or more RF coils. The controller unit may be configured to cause the image capture device to perform a labeling experiment, capture a first image of a slice or slices of body tissue, perform a control experiment, and capture a second image of that same slice or slices of body tissue. In a specific embodiment, they may be configured to perform a ninety (90) degree RF saturation pulse directed to a portion of body tissue that is superior to the images slice(s) of body tissue during at least one of the labeling experiment and/or the control experiment, and to apply a spoiler gradient subsequent to the saturation pulse during at least one of the labeling experiment and/or the control experiment.

In a further embodiment, the image capture device may apply a plurality of ninety (90) degree RF saturation pulse. In still another embodiment, the image capture device may apply a plurality of spoiler gradients, each spoiler gradient following a ninety (90) degree RF saturation pulse. Alternatively, the image capture device may apply spoiler gradients subsequent to the plurality of ninety (90) degree RF saturation pulse. In a further embodiment, the image capture device may apply a one-hundred-and-eighty (180) degree phase shift to one or more of the ninety (90) degree RF saturation pulse.

A method is also presented for active suppression of venous artifacts caused by superior tagging in flow-sensitive alternating inversion recovery. In one embodiment, the method includes performing a labeling experiment, capturing a first image of a slice of body tissue, performing a control experiment, where the control experiment performing a ninety (90) degree RF saturation pulse directed to a portion of body tissue that is superior to the second image of the slice of body tissue, and applying a spoiler gradient subsequent to the saturation pulse. Finally, the method may include the RF and gradient combination to achieve saturation during the initial labeling experiment.

The term "coupled" is defined as connected, although not necessarily directly, and not necessarily mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION

Figure 1:
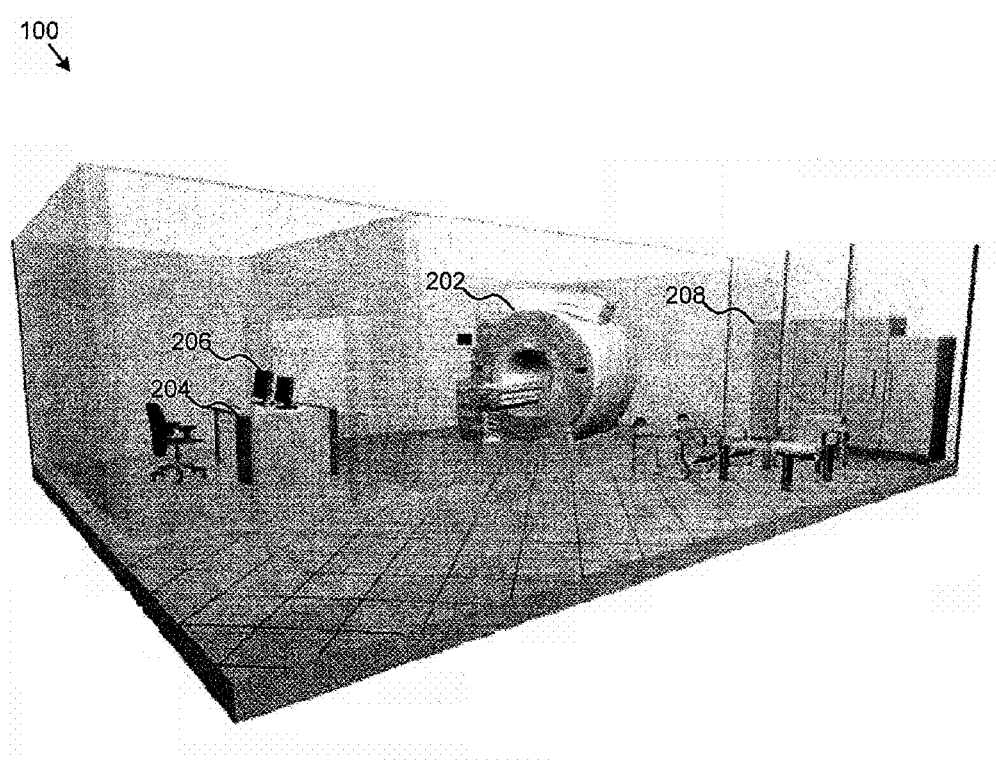
FIG. 1 is a schematic block diagram illustrating one embodiment of a system for active suppression of venous artifacts arising from superior tagging in flow-sensitive alternating inversion recovery.

The invention and the various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only and not by way of limitation. Various substitutions, modifications, additions, and/or rearrangements within the spirit and/or scope of the underlying inventive concept will become apparent to those skilled in the art from this disclosure.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

FIG. 1 illustrates one embodiment of a system 100 for active suppression of superior tagging in flow-sensitive alternating inversion recovery. The system 100 may include an image capture device 102 and a controller unit 104. In a further embodiment, the system 100 may include a user interface 106 and other support devices 108, including power sources, data storage devices, networking devices, image processing devices, etc.

In the depicted embodiment, the image capture device 102 may include a magnetic resonance (MR) medical imaging device. For example, the present embodiments may include a 3T Siemens® Trio TIM whole-body scanner, or similar system. The image capture device may further include a 60 cm diameter magnet bore and SQ gradients (maximum gradient strength 45 mT/m in the z direction and 40 mT/m in the x and y directions, maximum slew rate 200 mT/m·ms, 200 µs rise time). The image capture device may include magnet, one or more gradient magnets or coils, and one or more Radio Frequency (RF) coils. In a particular embodiment, the image capture device 102 may include 12-channel phased array detector coils.

The controller unit 104 may include a software application, program, process, or algorithm configured to generate control signals for the imaging device 102. The controller unit 104 may then communicate the control signals to the imaging device 102. For example, the controller unit 104 may communicate control signals configured to control the polarity or magnetic orientation of a field produced by the gradient coils. The control unit 104 may also control the frequency and timing of a signal powering the RF coils. In a further embodiment, the control unit 104 may control patient positioning. The control signals may further control phase angles of the 12-channel phased array detector coils. In such embodiments, the controller unit 104 may generate the control signals in response to one or more imaging sequence parameters. The imaging sequence parameters may be user inputs, selectable controls, a calculated result of user inputs or controls, predefined operation programs, or the like.

In a further embodiment, the control unit 104 may process signals received from the imaging unit 102. For example, the control unit 104 may generate images from data received from the imaging unit 102. In further embodiments, the control unit 104 may filter, enhance, color, or otherwise process the resulting images in response to one or more user selections or predefined processes.

Figure 2:
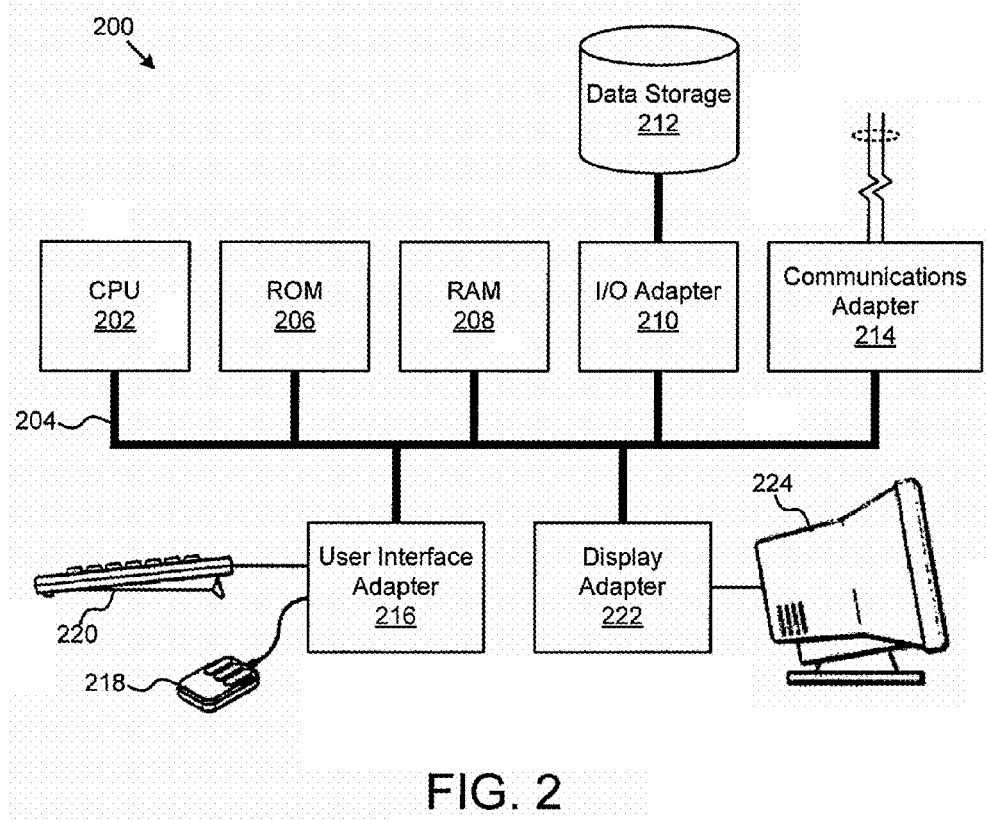
FIG. 2 is a schematic block diagram illustrating one embodiment of a computer system that may be used in accordance with certain embodiments of the system for active suppression of venous artifacts from superior tagging in flow-sensitive alternating inversion recovery.

FIG. 2 illustrates a computer system 200 adapted according to certain embodiments of the controller unit 104. The central processing unit (CPU) 202 is coupled to the system bus 204. The CPU 202 may be a general purpose CPU or microprocessor. The present embodiments are not restricted by the architecture of the CPU 202, so long as the CPU 202 supports the modules and operations as described herein. The CPU 202 may execute the various logical instructions according to the present embodiments. For example, the CPU 202 may execute machine-level instructions according to the exemplary operations described below with reference to FIG. 3.

The computer system 200 also may include Random Access Memory (RAM) 208, which may be SRAM, DRAM, SDRAM, or the like. The computer system 200 may utilize RAM 208 to store the various data structures used by a software application configured to active suppression of superior tagging in flow-sensitive alternating inversion recovery. The computer system 200 may also include Read Only Memory (ROM) 206 which may be PROM, EPROM, EEPROM, or the like. The ROM may store configuration information for booting the computer system 200. The RAM 208 and the ROM 206 hold user and system 100 data.

The computer system 200 may also include an input/output (I/O) adapter 210, a communications adapter 214, a user interface adapter 216, and a display adapter 222. The I/O adapter 210 and/or user the interface adapter 216 may, in certain embodiments, enable a user to interact with the computer system 200 in order to input information for authenticating a user, identifying an individual, or receiving health profile information. In a further embodiment, the display adapter 222 may display a graphical user interface associated with a software or web-based application for presenting a natural history of a disease.

The I/O adapter 210 may connect to one or more storage devices 212, such as one or more of a hard drive, a Compact Disk (CD) drive, a floppy disk drive, a tape drive, to the computer system 200. The communications adapter 214 may be adapted to couple the computer system 200 to the imaging unit 102. The user interface adapter 216 couples user input devices, such as a keyboard 220 and a pointing device 218, to the computer system 200. The display adapter 222 may be driven by the CPU 202 to control the display on the display device 224.

The present embodiments are not limited to the architecture of system 200. Rather the computer system 200 is provided as an example of one type of computing device that may be adapted to perform the functions of the controller unit 104. Moreover, the present embodiments may be implemented on digital signal processor (DSPs), application specific integrated circuits (ASIC) or very large scale integrated (VLSI) circuits. In fact, persons of ordinary skill in the art may utilize any number of suitable structures capable of executing logical operations according to the described embodiments.

The schematic flow chart diagrams that follow are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 3A:
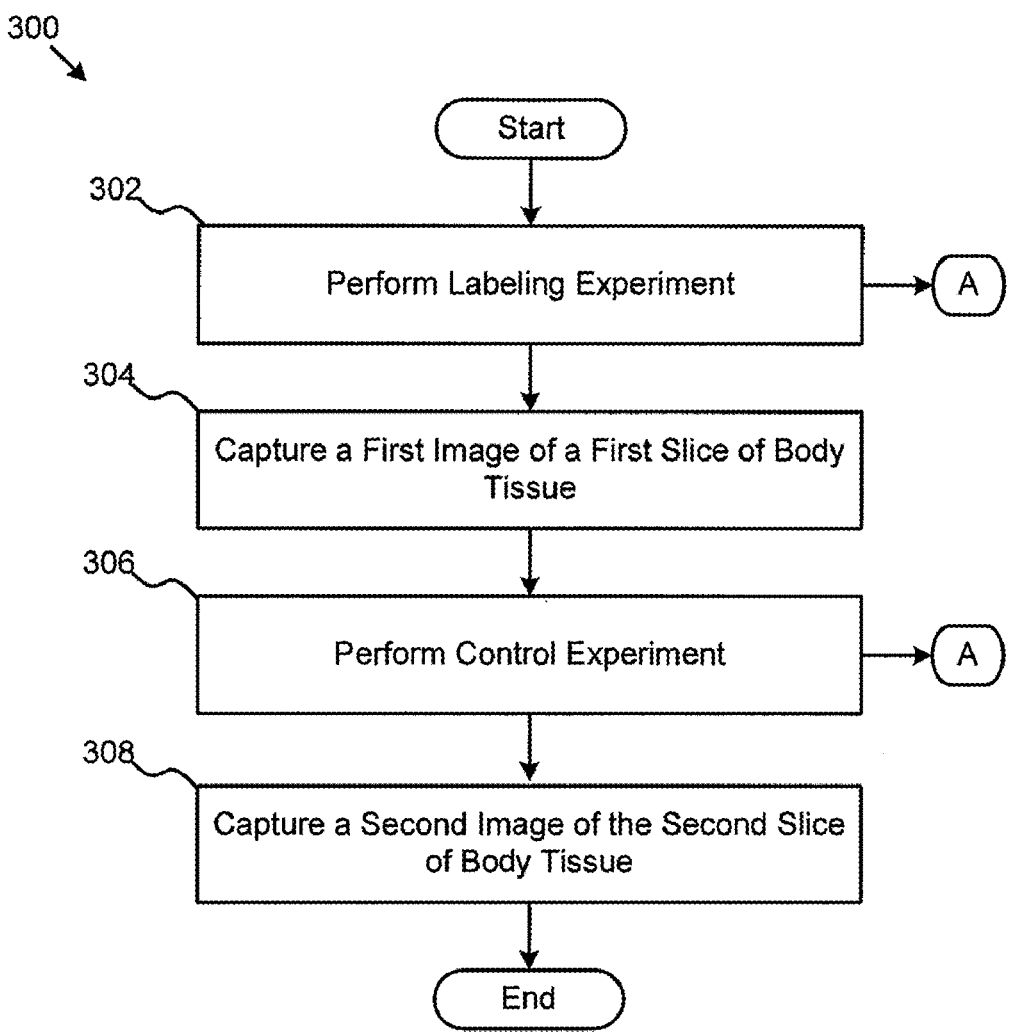
FIG. 3 is a schematic flow-chart diagram illustrating one embodiment of a method for active suppression of venous artifacts from superior tagging in flow-sensitive alternating inversion recovery.
Figure 3B:
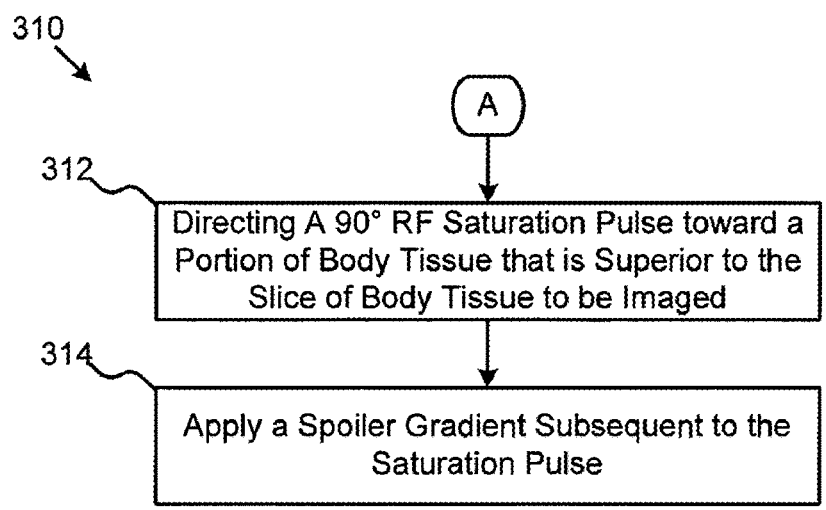

FIG. 3 illustrates one embodiment of a method 300 for active suppression of superior tagging in flow-sensitive alternating inversion recovery. In one embodiment, the method 300 starts when the controller unit 104 causes the image capture device 102 to perform 302 a labeling experiment. In one embodiment, the labeling experiment may include a sub-process for actively suppressing venous blood signals labeled as sub-process A 310. Sub-process A 310 may include directing 312 a 90 degree RF saturation pulse toward a portion of body tissue that is superior to the imaged portion of body tissue, and applying 314 a spoiler gradient subsequent to the saturation pulse. Alternatively, performing 302 the labeling experiment may include standard labeling procedures as performed with typical FAIR processes. In either embodiment, the controller unit 104 may then cause the image capture device 102 to capture 304 a first image of a first slice of body tissue.

In a further embodiment, the method 300 may include performing 306 a control experiment. In certain embodiments, performing 306 the control experiment may also include a sub-process for actively suppressing venous blood signals labeled as sub-process A 310. Sub-process A 310 may include directing 312 a 90 degree RF saturation pulse toward a portion of body tissue that is superior to the imaged portion of body tissue, and applying 314 a spoiler gradient subsequent to the saturation pulse. Alternatively, performing 306 the control experiment may include standard control experiment procedures as performed with typical FAIR processes. In either embodiment, the controller unit 104 may then cause the image capture device 102 to capture 308 a second image of the slice of body tissue.

In a further embodiment, the sub-process 310 may include applying a plurality of ninety (90) degree RF saturation pulses. In still another embodiment, the sub-process 310 includes applying a plurality of spoiler gradients, each spoiler gradient following a ninety (90) degree RF saturation pulse. Alternatively, the sub-process 310 includes applying spoiler gradients subsequent to the plurality of ninety (90) degree RF saturation pulse. In a further embodiment, the sub-process 310 includes applying a one-hundred-and-eighty (180) degree phase shift to one or more of the ninety (90) degree RF saturation pulses.

Figure 4A:
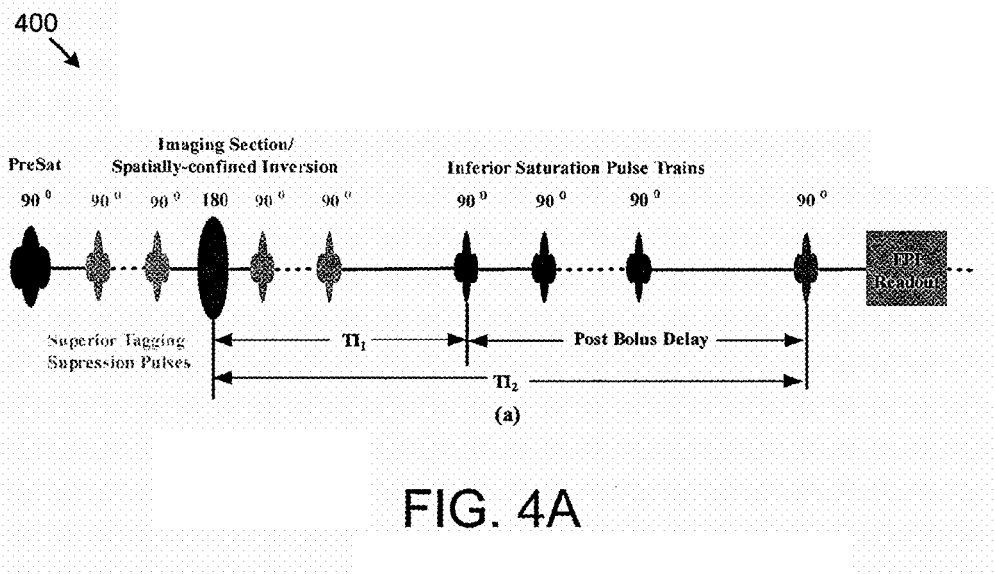
FIG. 4A is a schematic sequence diagram illustrating one embodiment of a pulse sequence for active suppression of venous artifacts from superior tagging in flow-sensitive alternating inversion recovery.
Figure 4B:
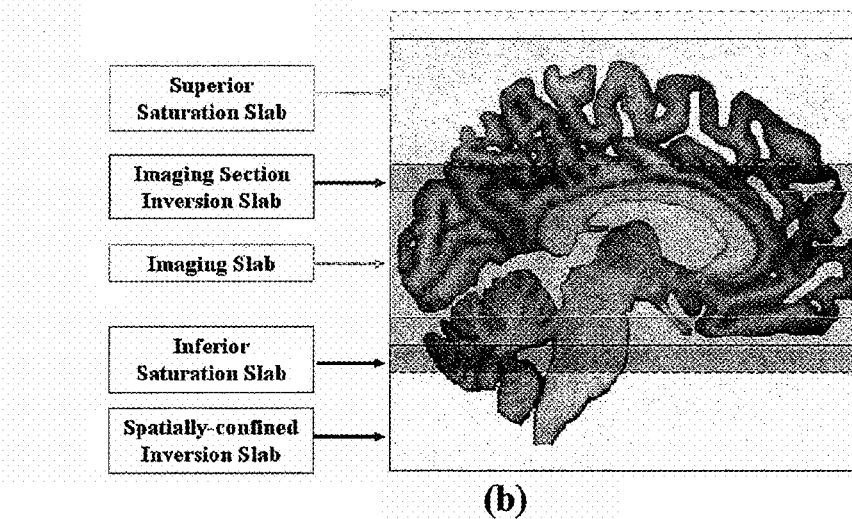
FIG. 4B is a layout diagram illustrating one embodiment of MR slab layout in accordance with the sequence of FIG. 4A.

FIG. 4A describes FAIR ASST techniques that may actively suppress the labeled venous blood signals at the labeling stage (or at the control stage) of FAIR. This may be achieved by performing several superior saturation pulses around the inversion pulses in both labeling and control experiments. The labeling experiments may include imaging section inversion and control experiments may include spatially-confined inversion pulses. Additionally, a larger saturation slab size may be used, which will depend on the size of the labeling slab on the superior side as illustrated in FIG. 4B. Before the inversion pulses, one or more superior saturation pulses may be performed to decrease the initial magnetization intensity that may be affected by the inversion pulses in both labeling and control experiments. After the inversion pulses, one or more superior saturation pulses may be performed to further destroy the magnetization in both labeling and control experiments. For CBF quantification purpose, a Q2TIPS scheme can also be used with FAIR ASST, which is referred to herein as FAIR ASST with Q2TIPS.

As described above, the superior saturation effects may be achieved by performing a 90-degree RF pulse saturation and standard a spoiler gradient. There may be alternative ways to perform the superior saturations, especially the post-inversion superior saturations. One consideration in choosing a method is the different RF pulses, labeling and control experiments, and the flowing of venous blood complicate the situation so that it is difficult to predict signal evolutions precisely and correctly.

To better discriminate different FAIR ASST methods, three modes were defined according to the features of post-inversion superior saturations: 0, 1 and 2. In mode 0, there may be no phase difference between the first two post-inversion superior saturation pulses in both control and labeling experiments. In one embodiment, Mode 1 is the same as mode 0, except that there is a 180-degree phase difference between the first two post-inversion superior saturation pulses in the control experiment. In one embodiment of mode 2, the first two post-inversion superior saturation pulses are always performed with a 180-degree phase difference in the control experiment, and only the second one is followed by a spoiler gradient in both control and labeling experiments. In modes 1 and 2, after the first two post-inversion superior saturation pulses, additional user-defined post-inversion superior saturation pulses may be applied in the same way as in mode 0, (e.g., saturation and spoiling). Embodiments of FAIR ASST methods with single post-inversion superior saturation pulse may be included in mode 0. In Table 1, the comparisons between embodiments of three modes of FAIR ASST are listed. In such embodiments of FAIR ASST methods, pre-inversion superior saturation pulses may have a following spoiler gradient.

TABLE 1

Comparisons of implemented three modes of FAIR ASST technique

| FAIR ASST Modes | Phase Difference for the First Two PSSP in Control Experiment (degree) | Spoiler Gradient (s) for the First Two PSSP | Consideration of Source of Residues |
|---|---|---|---|
| 0 | 0 | Each | Incomplete dephase |
| 1 | 180 | Each | Incomplete dephase |
| 2 | 180 | The second | Flow effects |

PSSP: post-inversion superior saturation pulses

FAIR ASST methods from different modes may be different in terms of physical principles. For example, in FAIR ASST methods from modes 0 and 1, the residual of labeled venous blood using methods from these two modes will be zero, if the first two post-inversion superior saturations can completely saturate labeled venous blood (completely dephase). Otherwise, the residual from the methods of mode 0 may be much larger than that from the methods of mode 1. One possible explanation for this is that for the methods from mode 1, the residual of labeled venous blood spins from both control and labeling experiments will point in the same direction due to the 180-phase difference between the first two post-inversion superior saturation pulses in the control experiment. In another embodiment, mode 2 may use the first two post-inversion superior saturation pulses to rotate the magnetization of the blood by 180 degrees in the labeling experiment while the first two post-inversion superior saturation pulses keep the magnetization pointed in the original direction in the control experiment, making the magnetizations from both labeling and control experiments point in the same direction. If labeled venous blood does not flow very fast, relatively less residual may be generated by the methods from mode 2 due to longer RF radiation before spoiling and following saturations. However, effective FAIR ASST methods from the three modes perhaps may not give significantly different CBF measurements if the residues due to underlying physical differences are subtle. To help understand the possible magnetization residues after two post-inversion superior saturation pulses, for both control and labeling experiments, example directions of the magnetization in the superior labeling site are listed in Table 2 for each mode as well as the initial state.

TABLE 2

Directions of initial magnetization and magnetization residues at the superior labeling site after the first two post-inversion superior saturation pulses for each mode

| ASL Experiments | Magnetization Directions | | | |
|---|---|---|---|---|
| | Initial | Mode 0 | Mode 1 | Mode 2 |
| Control | ↓ | ↑ | ↓ | ↓ |
| Labeling | ↑ | ↓ | ↓ | ↓ |

To simplify the representation of these methods, a coding scheme is used to indicate the mode number and the number of pre-inversion and post-inversion superior saturation pulses: for method XYZ, X represents the mode number, Y represents the pre-inversion superior saturation pulse number and Z represents the post-inversion superior saturation pulse number. For mode 2, the last digit only represents the number of extra user-defined post-inversion superior saturation pulses in addition to the initial two phase-inverted superior saturation pulses. For example, FAIR ASST method 000, may be the traditional FAIR method (spatially-confined FAIR with Q2TIPS).

The saturation pulses and spoiler gradient used for superior saturation may be the same as those used for imaging section pre-saturation. The spoiler gradients in the superior saturation pulses may run along slice and readout directions simultaneously.

The methods disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope of the invention.

In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

EXAMPLES

Figure 5:
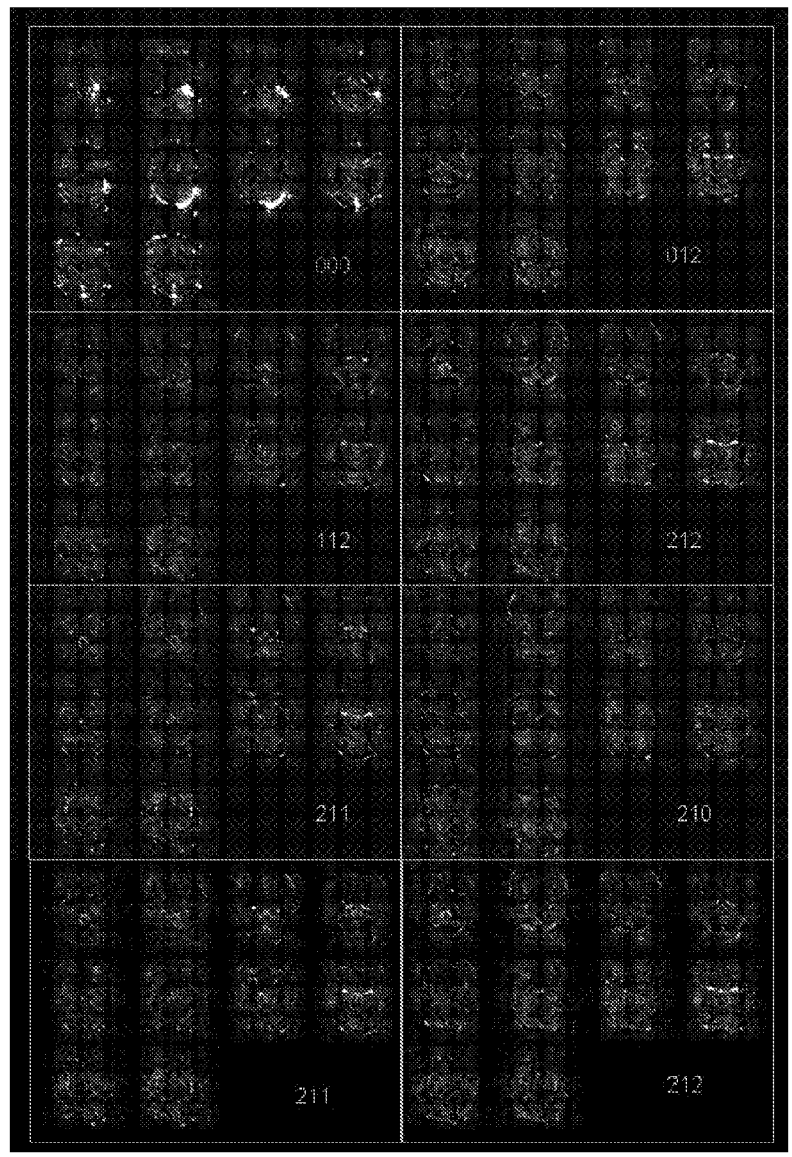
FIG. 5 is one representative subject's perfusion-weighted imaging maps from FAIR ASST evaluation study I using traditional FAIR and selected effective FAIR ASST methods.

FIG. 5 is a sample result comparing traditional FAIR and selected FAIR ASST methods. In the illustrated embodiment, four FAIR ASST methods were shown to be effective, including (012, 112, 211, and 023). These methods were contrasted with the traditional FAIR method (000). In this study, the following parameters were set: TR/TE=2500/9.2 ms, FOV=230×230 mm$^2$, matrix size=66×66, resolution=3.5×3.5 mm$^2$, the number of imaging slices=16, slice thickness=3.5 mm with 20% gap, the number of measurements=110.

Additionally, quantitative perfusion studies were performed using three FAIR ASST methods (012,112, and 221) on three parts of the brain with the comparison to the control method (000). In total supply of health e-mail adults (age range 26 to 40 years) took part in this quantitative perfusion study. MRI parameters used in the study were exactly the same as those in the previous study.

Figure 6:
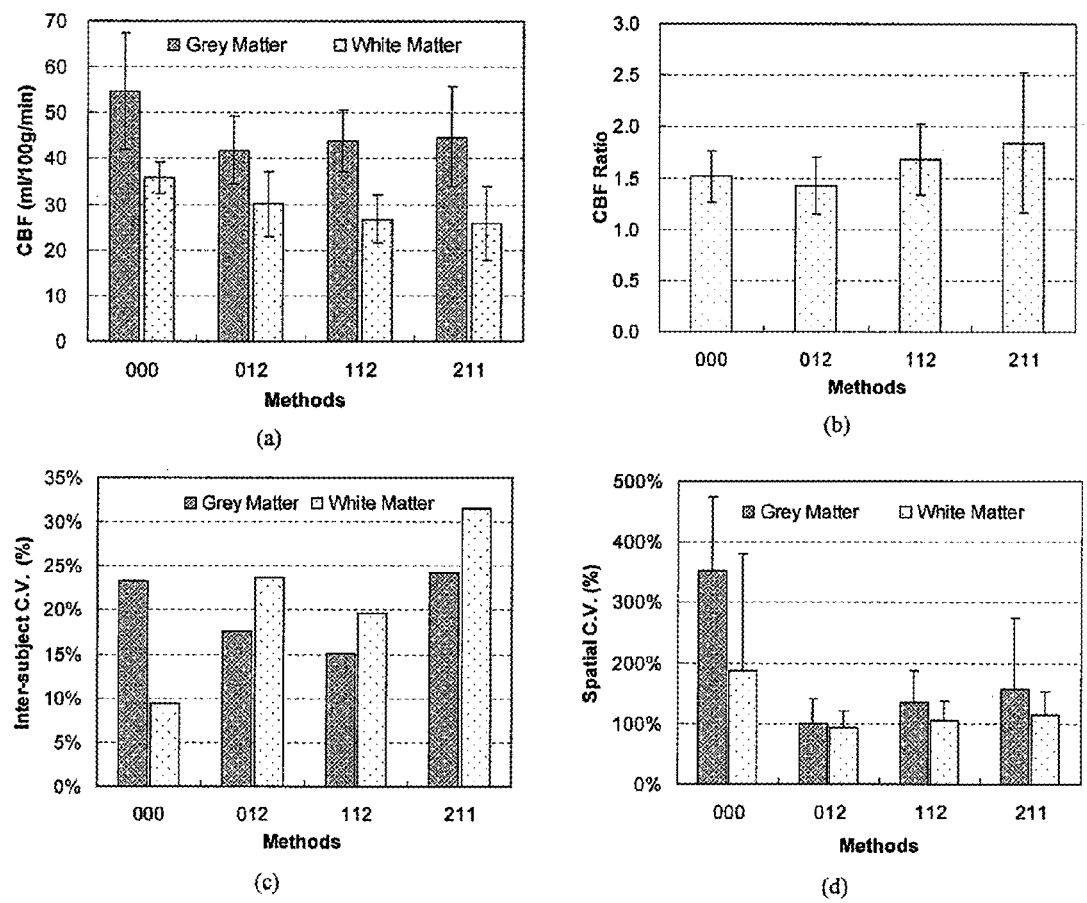
FIG. 6 shows analysis results for the evaluation study in cerebellum region: (a) CBF estimations, (b) CBF ration between grey matter and white matter, (c) inter-subject variability and (d) spatial variability.
Figure 7:
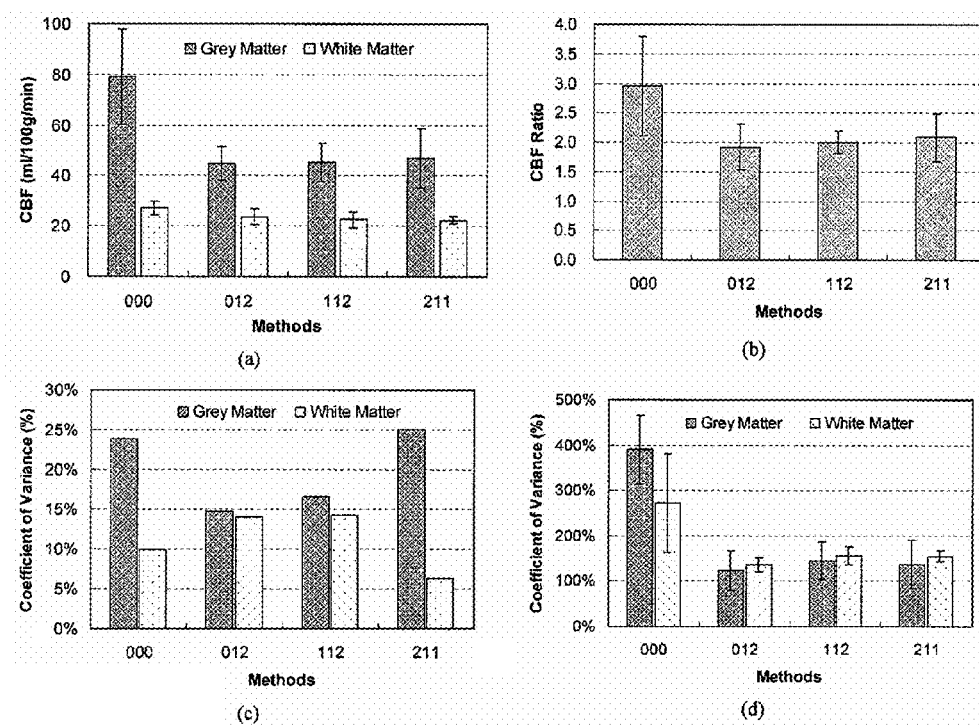
FIG. 7 shows analysis results for the evaluation study in the inferior part of the brain region: (a) CBF estimations, (b) CBF ratio between grey matter and white matter, (c) inter-subject variability and (d) spatial variability.
Figure 8:
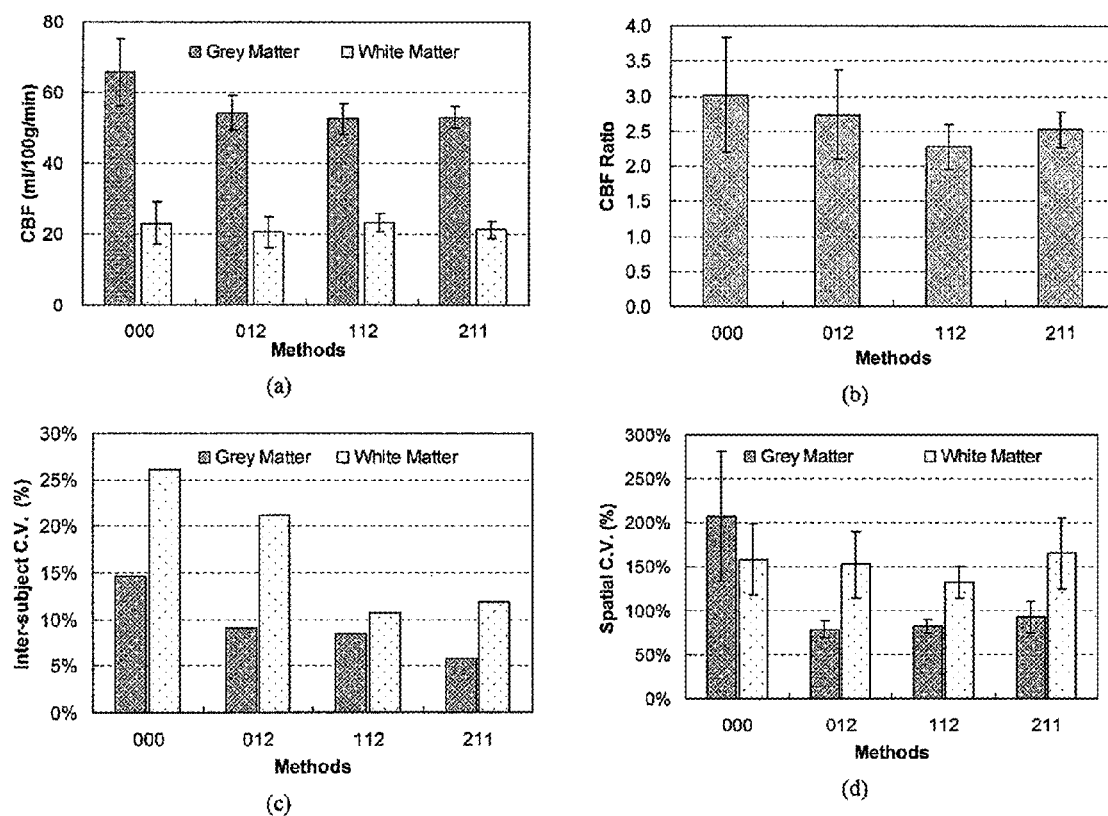
FIG. 8 analysis results for the evaluation study in deep brain region: (a) CBF estimations, (b) CBF ratio between grey matter and white matter, (c) inter-subject variability and (d) spatial variability.
Figure 9:
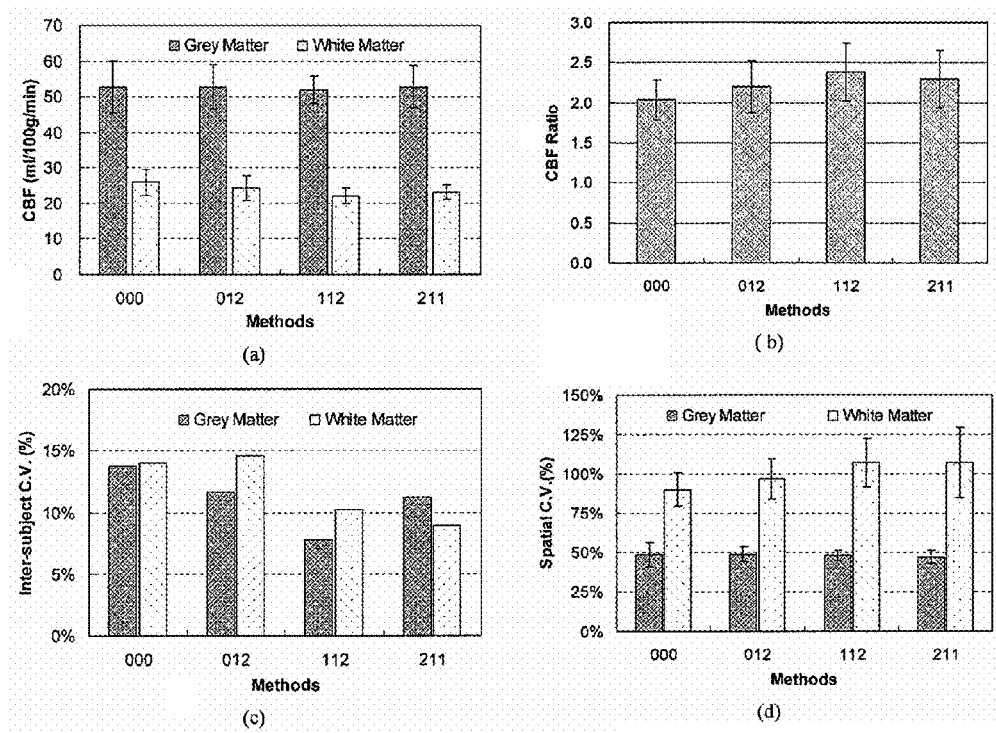
FIG. 9 analysis results for the evaluation study in superior part of the brain region: (a) CBF estimations, (b) CBF ratio between grey matter and white matter, (c) inter-subject variability and (d) spatial variability.

FIG. 6 illustrates sample analysis results for the evaluation study in the cerebellum region. Chart (a) illustrates CBF estimations, chart (b) illustrates CBS ratio between gray matter and white matter, chart (c) illustrates inter-subject variability, and chart (d) illustrates spatial variability. FIG. 7 illustrates sample analysis results for the evaluation study any inferior part of the brain region. Graph (a) illustrates CBF estimations, graph (b) illustrates CBS ratio between gray matter and white matter, chart (c) illustrates inter-subject variability, and chart (d) illustrates spatial variability. FIG. 8 illustrates sample analysis results for the evaluation study in the deep brain region. Similarly, graph (a) illustrates CBF estimations, graph (b) illustrates CBS ratio between gray matter and white matter, chart (c) illustrates inter-subject variability, and chart (d) illustrates spatial variability. FIG. 9 illustrates sample analysis results for the evaluation study in the superior part of the brain region.

Study results from evaluation study I are summarized in Table 3 by using different colors for the coding digits of the tested methods. These study results indicated that many of the tested methods worked well (those methods with coding digits in green) across subjects. Particularly, only pre-inversion saturation or only post-inversion saturations could not robustly and successfully suppress the superior tagging of FAIR (for example, the methods 010, 003, 102 and 200). One typical subject's perfusion-weighted images from selected effective and non-effective methods are displayed in FIG. 5. Methods that did not work well for all subjects are indicated by using orange coding digits. The coding digits for the control method are presented in red. All other methods, with dark coding digits, could not completely suppress the superior tagging of FAIR. Interestingly, some FAIR ASST methods can effectively suppression venous artifacts but they tend to have adverse edge effects, such as method 201. Although both FAIR ASST methods 210 and 211 are effective, method 211 has following saturation that can further decrease subtraction errors. Therefore, FAIR ASST method 211 was selected for further testing.

TABLE 3

Effectiveness of tested FAIR ASST methods

| Mode No. | colored 3 digit representation of tested combinations | | | | | | | | | | |
|---|---|---|---|---|---|---|---|---|---|---|---|
| 0 | 000 | 001 | 002 | 003 | 010 | 011 | 012 | 013 | 020 | 021 | 022 | 023 |
| 1 | 102 | 103 | 112 | 113 | 122 | 123 | | | | | | |
| 2 | 200 | 201 | 202 | 210 | 211 | 212 | | | | | | |

Note:
methods in black - not effective for all subjects,
methods in green - effective across all subjects,
methods in orange - not effective across subjects,
method 000 (in red) - traditional FAIR method.

The study results from the second evaluation study showed that the selected methods effective in the previous study also worked well under more demanding conditions. Perfusion-weighted imaging maps for selected methods were generated. Although FAIR ASST methods with more superior saturation pulses can also successfully achieve our aim, those effective methods with minimal number of saturation pulses are safer for subjects and thus preferred.

The CBF analysis results for perfusion studies in the cerebellum area are presented in FIG. 6. The study results indicated that for both grey matter and white matter, traditional FAIR method (FAIR ASST 000) gave much higher CBF estimations than those from other FAIR ASST methods (about 25% higher relative to CBF estimations by FAIR ASST methods). The CBF measurements from the other three methods are very comparable for both grey and white matters (see FIG. 6A). For cerebellum grey matter CBF estimations, performed t-tests found significant differences between traditional FAIR method and other three methods, but no significant differences were found between FAIR ASST methods 112 and 211. For cerebellum white matter CBF estimations, although no significant difference was found between traditional FAIR method and FAIR ASST method 012, significant differences were found between traditional FAIR or FAIR ASST method 012 and FAIR ASST methods 112 or 211. The CBF ratios from FAIR ASST methods 112 and 211 tends to be higher although no consistent significant differences were found between methods 112 or 211 and other methods (000 or 012) (see FIG. 6B).

The analysis results for the inter-subject variability evaluation indicated that FAIR ASST method 112 may be the best one among the three effective FAIR ASST methods since it gave us the lowest C.V. for both grey matter and white matter CBF measurements across subjects (FIG. 6C). The perfusion uniformity evaluation results by spatial coefficient of variance indicated that CBF measurements by traditional FAIR method have great variance across space. Performed t tests showed significant difference between traditional FAIR method and any of the other three methods, but no significant differences were found between any two of the other three methods (FIG. 6D). The above observations from cerebellum perfusion analysis were held the same for data analysis results of CBF measurements in the inferior part of the brain (FIG. 7). The grey matter CBF measurement by traditional FAIR was much higher than that by FAIR ASST methods (about 75% higher relative to those by FAIR ASST methods). CBF ratio of CBF measurements using traditional FAIR technique was also pretty higher. FAIR ASST 112 method gave lower inter-subject and spatial variability for CBF measurements in the inferior part of the brain. Performed t-tests results showed that traditional FAIR is significantly different from the three FAIR ASST methods for all evaluated aspects.

The CBF analysis results for perfusion studies in the deep brain region are presented in FIG. 8. Grey matter CBF estimation by traditional FAIR method (000) was also higher than that by any other FAIR ASST method, which means, even in deep brain region, contributions from superior inflow is very large (still about 25% higher relative to CBF estimations using three effective FAIR ASST methods). FAIR ASST 112 method still gave lower inter-subject and spatial variability for CBF measurements in the deep brain. Performed t-test results showed that traditional FAIR is significantly different from FAIR ASST methods in terms of grey matter CBF estimation. No significant differences were found between FAIR ASST methods 112 and 211.

In FIG. 9, the CBF analysis results for perfusion studies in the superior part of the brain are presented. Four FAIR methods are comparable to each other in all evaluated aspects. That is, no significant differences were found between any two FAIR methods in terms of grey and white matter CBF estimations, CBF ratio, and spatial variability. Although both FAIR ASST methods 112 and 211 gave relatively lower inter-subject variability, but CBF estimations by using these two methods are very close to those from two other methods.

Figure 10:
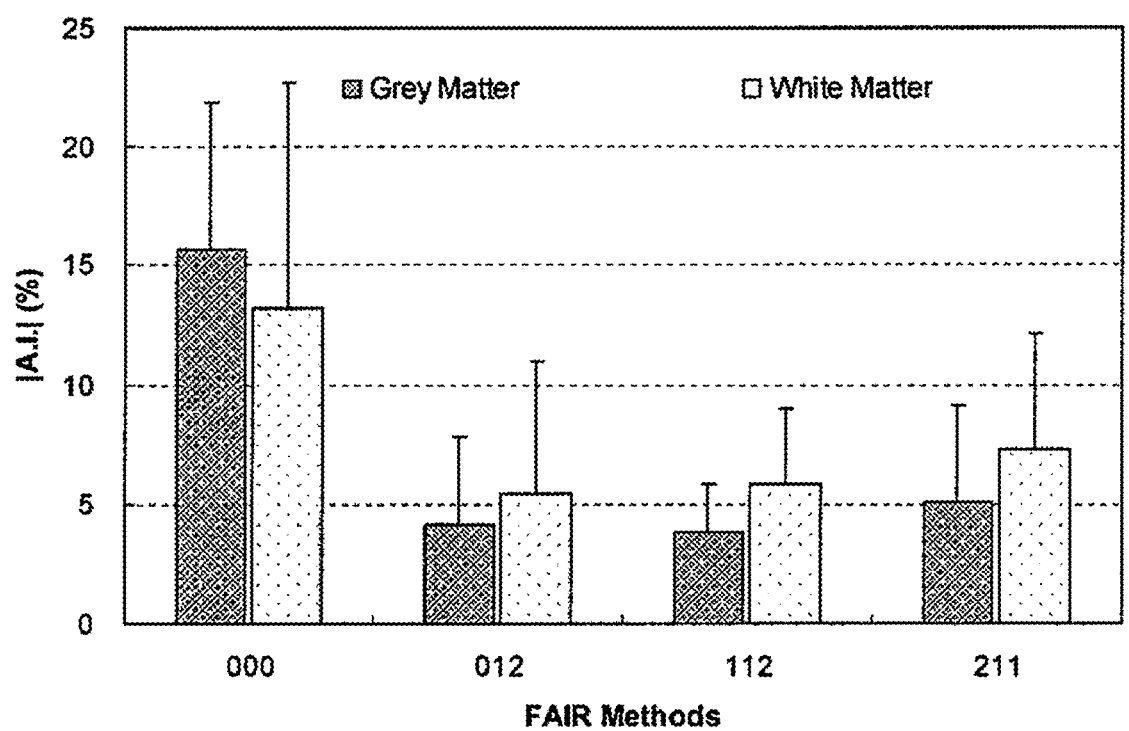
FIG. 10 shows asymmetry index (A.I.) analysis for cerebellum CBF measurements from four imaging slices near transverse sinuses.
Figure 11:
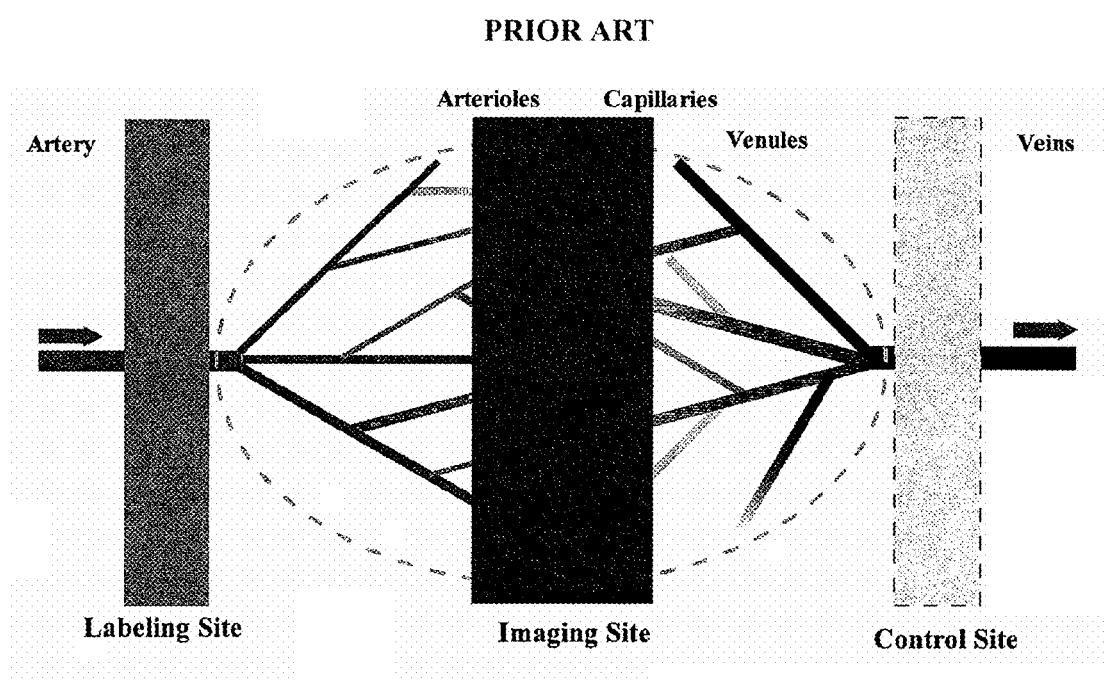
FIG. 11 is a schematic diagram for ASL imaging according to the prior art.

To quantitatively evaluate the extend ASL signals are wrongly registered between left and right lobes of the cerebellum with the assumption that cerebellum perfusion is symmetric, asymmetric index analysis was perform for cerebellum CBF measurements from middle four slices. The selected four slices contain the majority of cerebellum white matter. The analysis results are showed in FIG. 10. CBF measurements from all four FAIR methods are not symmetric between left and right lobes. In particular, cerebellum grey matter (data IA.I.I) from traditional FAIR method was observed to be significantly higher than that from any of the other methods. CBF (data IA.I.I) of cerebellum white matter from traditional FAIR was observed to be higher than those from other methods, although no significant difference was found based on the five subjects' data.

The possible reasons for the large asymmetry of cerebellum CBF measurements using traditional FAIR can be due to the fact that usually, transverse sinus are only dominant in one side for nearly all people, and therefore the artifacts generated by the labeled venous blood will be asymmetric. The measured smaller asymmetry of cerebellum CBF measurements using effective FAIR ASST methods can be due to the imperfection of the suppression of the venous effects by these methods.

Motions from all subjects in FAIR ASST evaluation study III were very small due to the good cooperation of subjects and appropriate padding. No significant differences were found for both translation and rotation motions between any two of four methods. Therefore, the effects from motions on the above analysis results should be negligible.

Compared to MDS FAIR, FAIR ASST can avoid the dilemma about the temporal width definition for superior bolus. By destroying superior tagging of FAIR, FAIR ASST methods only use the inferior bolus for CBF quantification, which is quite reasonable because superior bolus is not pure arterial blood but contains labeled venous blood. For perfusion studies in specific brain regions, such as pons and cerebellum, the major component of the superior bolus is labeled venous blood. More importantly, the venous blood generates adverse imaging artifacts for perfusion studies in the inferior part of the brain.

Very large superior saturation slab is used in FAIR ASST, and the interference between superior saturation slab and imaging section dose exist. However, the pre-inversion superior saturation pulses behave like pre-saturation, and the superior saturation pulses after inversion pulses can be done within tens of milliseconds, leaving little chance for these superior saturation pulses to affect labeled blood spins from the inferior bolus that is tens of millimeters away. Superior saturation pulses do not have MT effects issue since they are conducted exactly in the same way for both control and labeling experiments.

What is claimed is:

1. A method for active suppression of labeled venous blood signals in magnetic resonance imaging, the method comprising:
    performing a labeling experiment;
    capturing a first image of a slice of body tissue;
    performing a control experiment;
    capturing a second image of the slice of body tissue;
    performing a ninety (90) degree RF saturation pulse directed to a portion of body tissue that is superior to one of the first slices of body tissue imaged during at least one of the labeling experiment and the control experiment; and
    applying a spoiler gradient subsequent to the saturation pulse during at least one of the labeling experiment and the control experiment.

2. The method of claim 1, further comprising applying a plurality of ninety (90) degree RF saturation pulse.

3. The method of claim 2, further comprising applying a plurality of spoiler gradients, each spoiler gradient following a ninety (90) degree RF saturation pulse.

4. The method of claim 2, further comprising applying spoiler gradients subsequent to the plurality of ninety (90) degree RF saturation pulse.

5. The method of claim 2, further comprising applying a one-hundred-and-eighty (180) degree phase shift to one or more of the ninety (90) degree RF saturation pulses.

6. A system for active suppression of labeled venous blood signals in magnetic resonance imaging, the system comprising:
    an image capture device comprising:
        magnet;
        one or more gradient coils; and
        one or more RF coils; and
    a controller unit configured to cause the image capture device to:
        perform a labeling experiment;
        capture a first image of a slice of body tissue;
        perform a control experiment;
        capture a second image of the slice of body tissue;
        perform a ninety (90) degree RF saturation pulse directed to a portion of body tissue that is superior to one of the first slices of body tissue imaged during at least one of the labeling experiment and the control experiment; and
        apply a spoiler gradient subsequent to the saturation pulse during at least one of the labeling experiment and the control experiment.

7. The system of claim 6, where the image capture device is further configured to apply a plurality of ninety (90) degree RF saturation pulse.

8. The system of claim 7, where the image capture device is further configured to apply a plurality of spoiler gradients, each spoiler gradient following a ninety (90) degree RF saturation pulse.

9. The system of claim 7, where the image capture device is further configured to apply spoiler gradients subsequent to the plurality of ninety (90) degree RF saturation pulse.

10. The system of claim 7, where the image capture device is further configured to apply a one-hundred-eighty (180) degree phase shift to one or more of the ninety (90) degree RF saturation pulses.

11. A non-transitory computer program product comprising a computer readable medium having computer usable program code executable to perform operations for active suppression of labeled venous blood signals in magnetic resonance imaging, the operations of the computer program product comprising:
    performing a labeling experiment;
    capturing a first image of a slice of body tissue;
    performing a control experiment;
    capturing a second image of the slice of body tissue;
    performing a ninety (90) degree RF saturation pulse directed to a portion of body tissue that is superior to one of the first slices of body tissue imaged during at least one of the labeling experiment and the control experiment; and
    applying a spoiler gradient subsequent to the saturation pulse during at least one of the labeling experiment and the control experiment.

12. The non-transitory computer program product of claim 11, where the operations further comprise applying a plurality of ninety (90) degree RF saturation pulse.

13. The non-transitory computer program product of claim 12, where the operations further comprise applying a plurality of spoiler gradients, each spoiler gradient following a ninety (90) degree RF saturation pulse.

14. The non-transitory computer program product of claim 12, where the operations further comprise applying spoiler gradients subsequent to the plurality of ninety (90) degree RF saturation pulse.

15. The non-transitory computer program product of claim 12, where the operations further comprise applying a one-hundred-eighty (180) degree phase shift to one or more of the ninety (90) degree RF saturation pulses.

* * * * *